United States Patent
Lee et al.

(10) Patent No.: US 8,149,941 B2
(45) Date of Patent: Apr. 3, 2012

(54) DTV TELEVISION TRANSMITTER/RECEIVER AND METHOD OF PROCESSING DATA IN DTV TRANSMITTER/RECEIVER

(75) Inventors: Hyoung Gon Lee, Seoul (KR); In Hwan Choi, Gyeonggi-do (KR); Kyung Won Kang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/196,773

(22) Filed: Aug. 2, 2011

(65) Prior Publication Data

US 2012/0027102 A1    Feb. 2, 2012

Related U.S. Application Data

(63) Continuation of application No. 13/053,146, filed on Mar. 21, 2011, now Pat. No. 8,014,459, which is a continuation of application No. 11/514,125, filed on Aug. 30, 2006, now Pat. No. 7,936,837.

(30) Foreign Application Priority Data

Jan. 20, 2006  (KR) ........................ 10-2006-0006517

(51) Int. Cl.
H04L 5/12 (2006.01)
(52) U.S. Cl. ........................................ 375/265
(58) Field of Classification Search .................. 375/260, 375/265
See application file for complete search history.

(56) References Cited

U.S. PATENT DOCUMENTS

| | | | |
|---|---|---|---|
| 6,072,829 A | 6/2000 | Dirr | |
| 6,967,690 B2 | 11/2005 | Choi et al. | |
| 7,068,326 B2 | 6/2006 | Choi et al. | |
| 2002/0085632 A1 | 7/2002 | Choi | |
| 2002/0194570 A1 | 12/2002 | Birru et al. | |
| 2003/0099303 A1 | 5/2003 | Birru et al. | |
| 2004/0090997 A1 | 5/2004 | Choi | |
| 2004/0179621 A1 | 9/2004 | Choi et al. | |
| 2005/0111586 A1* | 5/2005 | Kang et al. | 375/321 |
| 2005/0152446 A1 | 7/2005 | Choi | |
| 2007/0140292 A1* | 6/2007 | Sestok et al. | 370/465 |
| 2007/0171941 A1 | 7/2007 | Lee et al. | |
| 2011/0007822 A1 | 1/2011 | Choi et al. | |

FOREIGN PATENT DOCUMENTS

| | | |
|---|---|---|
| WO | 2005-071958 | 8/2005 |
| WO | 2005-109878 | 11/2005 |

* cited by examiner

Primary Examiner — Don N Vo
(74) Attorney, Agent, or Firm — Lee, Hong, Degerman, Kang & Waimey

(57) ABSTRACT

A DTV transmitter includes a pre-processor pre-processing enhanced data, a data formatter generating enhanced data packets including known data, a multiplexer multiplexing the enhanced data packets with main data packets, a data randomizer randomizing the multiplexed data packets, an RS encoder RS-encoding the randomized data packets, and a data interleaver interleaving the RS-coded data packets, where a plurality of known data sequences are included in the interleaved enhanced data packets. Finally, the DTV transmitter further includes an enhanced encoder which codes each block of enhanced data placed between any two of the known data sequences and bypasses the interleaved main data packets.

6 Claims, 11 Drawing Sheets

DTV TELEVISION TRANSMITTER/RECEIVER AND METHOD OF PROCESSING DATA IN DTV TRANSMITTER/RECEIVER

CROSS-REFERENCE TO RELATED APPLICATIONS

This application is a continuation of U.S. patent application Ser. No. 13/053,146, filed on Mar. 21, 2011 (and issued as U.S. Pat. No. 8,014,459 on Sep. 6, 2011), which is a continuation of U.S. patent application Ser. No. 11/514,125, filed on Aug. 30, 2006 (and issued as U.S. Pat. No. 7,936,837 on May 3, 2011), which claims the benefit of earlier filing date and right of priority to Korean Patent Application No. 10-2006-0006517, filed on Jan. 20, 2006, the contents of all of which are hereby incorporated by reference herein in their entirety.

BACKGROUND OF THE INVENTION

1. Field of the Invention

The present invention relates to a digital communication system, and more particularly, to a digital television (DTV) transmitter/receiver and a method of processing data in the DTV transmitter/receiver.

2. Discussion of the Related Art

Generally, the 8T-VSB transmission system adopted as a digital broadcasting standard by Korea and North America is a digital broadcast system developed for MPEG video/audio data transmission.

As the digital signal processing technology rapidly develops with the global use of Internet, the tendency for combining digital home appliances, computer and Internet together rises. So, in order to meet the user's various demands, many efforts need to be made to develop a system capable of transmitting various supplemental data with video/audio data.

A user of supplemental data broadcasting is expected to use the supplemental data broadcasting using a PC card or portable device having a simple type indoor antenna attached thereto.

Yet, signal intensity can be considerably decreased due to a shield effect of a wall and an influence of a near moving object within an indoor space and broadcast receiving performance can be reduced due to a ghost and noise generated from a reflective wave. Unlike a case of general video/audio data, a case of supplemental data transmission should have a lower error rate. In case of the video/audio data, an error failing to be detected by human eyes/ears does not matter. Yet, in case of supplemental data (e.g., a program execution file, stock information, etc.), a 1-bit error can cause a serious problem. So, the demand for developing a system more persistent against ghost and noise generated from a channel rises.

Supplemental data transmission will be performed by time-division through the same channel of MPEG video/audio in general. Since the beginning of digital broadcasting, ATSC VSB digital broadcast receivers receiving the MPEG video/audio only have globally spread in markets. So, the supplemental data transmitted on the same channel of the MPEG video/audio should avoid causing any effect to the conventional ATSC VSB dedicated receiver previously supplied to the markets. Such a situation is defined as ATSC VSB compatibility. And, a supplemental data broadcast system should be compatible with the ATSC VSB system. Besides, the supplemental data could be called enhanced data or E-VSB data.

However, in a poor channel environment, reception performance of the conventional ATSC VSB reception system may be reduced. Specifically, a portable or mobile receiver needs higher robustness against a channel change and noise.

SUMMARY OF THE INVENTION

Accordingly, the present invention is directed to a digital broadcast system which is suitable for transmission of supplemental data and resistant against noise that substantially obviates one or more problems due to limitations and disadvantages of the related art.

An object of the present invention is to provide a digital broadcast system and a processing method, which are capable of inserting known data, which is previously known in transmitting/receiving ends, into a certain region of data interval to transmit it thereto, thereby enhancing receiving performance.

Another object of the present invention is to provide a digital broadcast system and a processing method, which are capable of performing added block encoding/decoding for enhanced data, thereby enhancing transmitting/receiving performance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter for processing main and enhanced data for transmission includes a pre-processor for pre-processing the enhanced data by coding the enhanced data for forward error correction (FEC) and expanding the FEC-coded enhanced data, a data formatter for generating enhanced data packets including the pre-processed enhanced data and for inserting known data into the enhanced data packets, and a first multiplexer for multiplexing the enhanced data packets with main data packets including the main data.

The DTV transmitter may further include a data randomizer for randomizing the multiplexed enhanced and main data packets, a first RS encoder for RS-coding the randomized data packets by adding first systematic parity data to each main data packet and adding first RS parity place holders to each enhanced data packet, and a first data interleaver for interleaving the RS-coded main and enhanced data packets, where the interleaved enhanced data packets include a plurality of known data sequences.

The DTV transmitter may further include an enhanced encoder for coding each block of enhanced data placed between any two of the known data sequences in the interleaved enhanced data packets and bypassing the interleaved main data packets. Two known data sequences which confine each block of enhanced data may be consecutive or non-consecutive.

In one example, The enhanced encoder may include a demultiplexer for demultiplexing the interleaved main and enhanced data packets, a block encoder for encoding each block of enhanced data placed between any two of the known data sequences in the demultiplexed enhanced data packets, a buffer for temporarily storing the demultiplexed main data, and a second multiplexer for multiplexing the encoded block of enhanced data and the main data stored in the buffer.

In another example, the enhanced encoder may include a demultiplexer for demultiplexing the interleaved main and enhanced data packets, an N-way interleaver for dividing each block of enhanced data placed between any two of the known data sequences in the demultiplexed enhanced data packets into N sub-blocks of enhanced data, a plurality of sub-block encoders for encoding the sub-blocks of enhanced data, respectively, a deinterleaver for deinterleaving the encoded sub-blocks of enhanced data, a buffer for temporarily storing the demultiplexed main data, and a second multiplexer for multiplexing the encoded sub-blocks of enhanced data and the main data stores in the buffer.

The DTV transmitter according to the present invention may further include a data deinterleaver for de-interleaving the data packets outputted from the enhanced encoder, and an RS parity remover for removing the first systematic parity data and the first RS parity place holders from the de-interleaved main and enhanced data packets. The DTV transmitter may further include a second RS encoder for RS-coding the deinterleaved main and enhanced data packets by adding second systematic parity data to each deinterleaved main data packet and adding second RS parity holders to each de-interleaved enhanced data packet, and a second data interleaver for interleaving the main and the enhanced data packets outputted from the second RS encoder.

In addition, the DTV transmitter may further include a byte-symbol converter for converting the data packets outputted from the second data interleaver into symbols, and a trellis encoder for trellis-encoding the converted symbols. The trellis encoder is initialized when the symbols represent a beginning of a known data sequence. The DTV transmitter may further include an initialization controller for generating initialization data symbols required to initialize one or more memories included in the trellis encoder, and a second multiplexer for outputting the initialization data symbols to the trellis encoder when the symbols represent the beginning of the known data sequence.

Furthermore, the DTV transmitter may further include a backward-compatibility processor for generating new parity symbols based on an output of the second RS encoder and the initialized data symbols and providing the new parity data symbols to the second multiplexer, which outputs the new parity symbols to the trellis encoder when the symbols outputted from the byte-symbol converter represent the second RS parity place holders.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The terminologies disclosed the present application are widely used in this fields of the present invention. However, some of them are defined by the inventors. In this case, the newly defined terminologies are described in detail in the following description. Therefore, the terminologies in the present invention will be understood on the basis of the disclosure of the present application.

Enhanced data in the present application may be any of application program execution files, data having information, such as stock information, etc., and video/audio data. Known data may be data which is previously known in transmitting/receiving ends, based on a protocol. Main data is indicative of data which can be received by the conventional receiving systems, including video/audio data.

The present invention serves to multiplex the enhanced data having information and the known data known in the transmitting/receiving ends, and to transmit them, to enhance receiving performance of a receiver.

Especially, the present invention serves to initialize a memory in a Trellis encoder at the beginning portion of the known data stream, and apply a block encoding for the enhanced data at the transmitting/receiving ends, using the initialization characteristics, to perform additional encoding/decoding.

Figure 1:
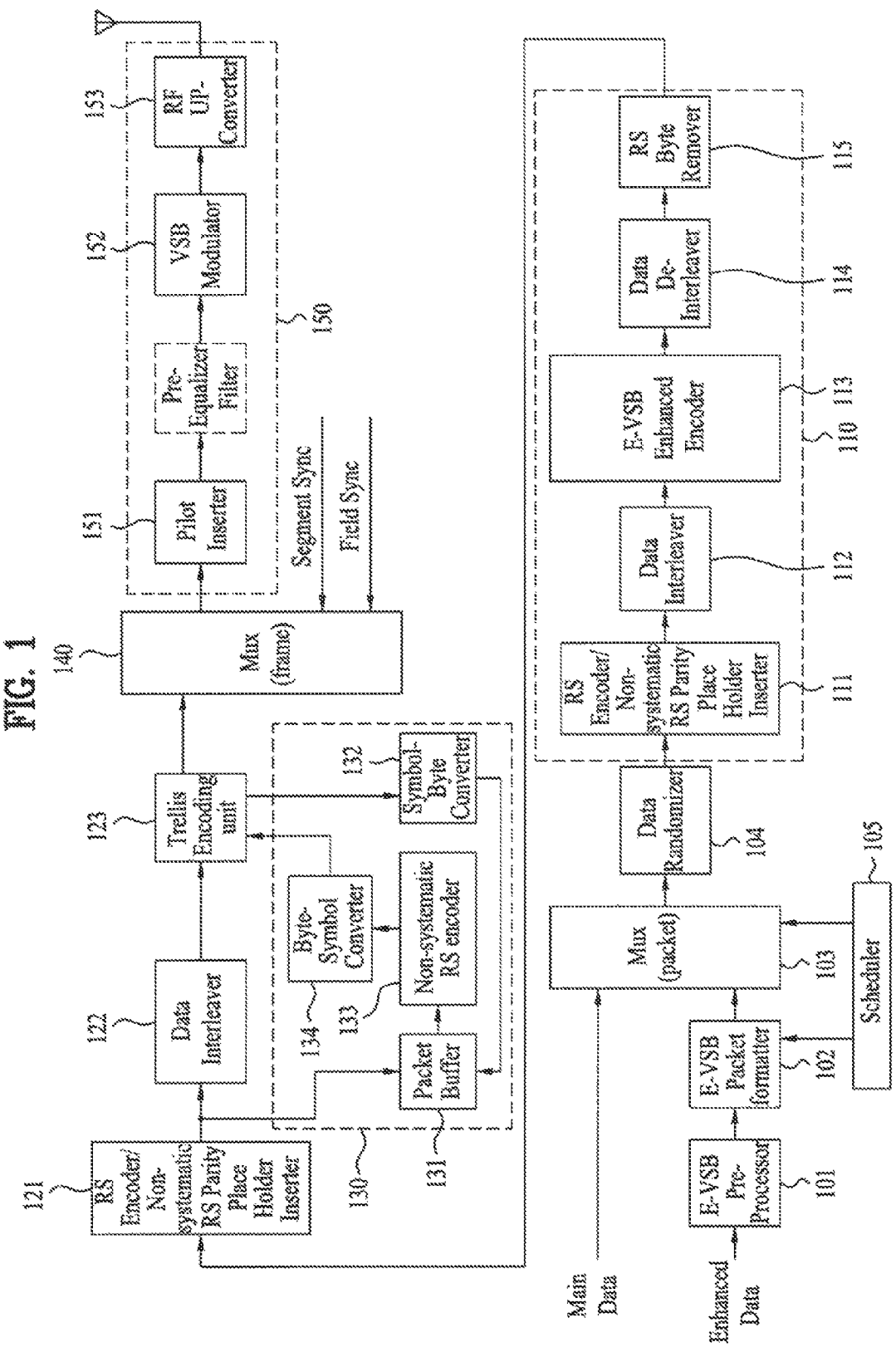
FIG. 1 illustrates a schematic block diagram of a digital broadcast transmitting system according to an embodiment of the present invention.

FIG. 1 illustrates a schematic block diagram of a digital broadcast transmitting system according to an embodiment of the present invention. The digital broadcast transmitting system includes an E-VSB preprocessor 101, an E-VSB packet formatter 102, a packet multiplexer 103, a data randomizer 104, a scheduler 105, an E-VSB post-processor 110, an RS encoder/Non-systematic RS parity holder inserter 121, a data interleaver 122, a Trellis encoding unit 123, a compatible processor 130, a frame multiplexer 140, and a transmitting unit 150.

Main data is outputted to the multiplexer 103, based on transport packet units. Enhanced data is outputted to the E-VSB preprocessor 101. The E-VSB preprocessor 101 performs pre-processes, such as additional error correction code, interleaving, insertion of null data, etc., regarding the enhanced data, and then outputs it to the E-VSB formatter 102.

The E-VSB packet formatter 102 includes at least one of the preprocessed enhance data and predetermined known data (or known data place holder), under control of the scheduler 105, and adds a 4-byte MPEG header thereto to form a MPEG packet based on 188 bytes. After that, the MPEG packet is outputted to the packet multiplexer 103.

The packet multiplexer 103 serves to perform time multiplexing, based on transport stream (TS) packet unit, for the main data packets and the enhanced data packet, according to pre-defined multiplexing method, under the control of the scheduler 105. Here, the main data packets and the enhanced data packet are formed on the basis of 188 byte unit.

Namely, the scheduler 105 generates a control signal such that the packet multiplexer 103 multiplexes main data packets and enhanced data packets, and then output them to the packet multiplexer 103. The packet multiplexer 103 receiving the control signal multiplexes the main data packets and the enhanced data packets, based on TS packet units, and outputs the multiplexed result.

The output of the packet multiplexer 103 is inputted to the data randomizer 104. The data randomizer 104 removes an MPEG synchronous byte from the input packet and randomizes the remaining 187 bytes using pseudo random bytes, which are generated therein, to output them to the E-VSB post-processor 110.

The E-VSB post-processor 110 includes an RS encoder/Non-systematic RS parity place holder inserter 111, a data interleaver 112, an E-VSB enhanced encoder 113, a data de-interleaver 114, and an RS byte remover 115.

The RS encoder/Non-systematic RS parity place holder inserter 111 performs a systematic RS encoding or a non-systematic RS parity holder insertion for the randomized data.

Namely, when the 187 byte packet, which is outputted from the data randomizer 104, is main data packet, the RS encoder/Non-systematic RS parity place holder inserter 111 performs systematic RS encoding, which is identical to that of a conventional ATSC VSB system, and adds a parity of 20 bytes to the end of the 187 byte data, to output it to the data interleaver 112.

On the other hand, when the 187 byte packet, which is outputted from the data randomizer 104, is enhanced data packet, the RS encoder/Non-systematic RS parity place holder inserter 111 inserts RS parity place holder, which is composed of null data of 20 bytes, in the packet, and inserts data of the enhanced data packet to places of the remaining 187 byte packet, correspondingly, to output them to the data interleaver 112.

The data interleaver 112 performs data interleaving for the output of the RS encoder/Non-systematic RS parity place holder inserter 111 to output it to the E-VSB enhanced encoder 113.

The E-VSB enhanced encoder 113 performs additional ½ encoding for only the enhanced data, which is outputted from the data interleaver 112, to output it to the data de-interleaver 114. The data de-interleaver 114 performs data de-interleaving for the inputted data to output it to the RS byte remover 115. Here, the data de-interleaver 114 performs a reverse process of the data interleaver 112.

Data interleaving of the data interleaver 112 and encoding of the E-VSB enhanced encoder 113 will be described later.

The RS byte remover 115 removes the 20 byte parity which is added in the RS encoder/Non-systematic RS parity place holder inserter 111. Here, when the inputted data is main data packet, the last 20 bytes of the 207 bytes are removed. When the inputted data is the enhanced data packet, parity place holders of 20 bytes of 207 bytes are removed, in which the parity place holders are inserted thereto to perform non-systematic RS encoding. Namely, such procedures for the enhanced data serve to re-calculate parity because original data is changed by the E-VSB enhanced encoder 113.

The output of the RS byte remover 115 is inputted to the RS encoder/Non-systematic RS parity holder inserter 121. When the 187 byte packet, which is outputted from the RS byte remover 115, is main data packet, similar to the RS encoder/Non-systematic RS parity place holder inserter 111, the RS encoder/Non-systematic RS parity holder inserter 121 performs systematic RS encoding, which is identical to a conventional ATSC VSB system, and inserts parity of 20 bytes to the end of the data of 187 bytes.

When the packet is enhanced data packet, byte places of 20 parities are determined in the packet to perform non-systematic RS encoding in the rear end of the compatible processor 130. After that, parities obtained after non-systematic RS encoding may be inserted in the determined byte places of parities or null byte instead of the parities may be inserted thereto. The bytes in the enhanced data packet are sequentially inserted in the places of the remaining 187 bytes. The null byte is determined by a certain value. The null byte is substituted with a parity value which is calculated in the non-systematic RS encoder 133 of the compatible processor 130.

Therefore, the null byte serves to secure a place of parity byte of non-systematic RS code. The output of the RS encoder/Non-systematic RS parity holder inserter 121 is outputted to the data interleaver 122. Also, when the packet is enhanced data packet, the output is inputted to the compatible processor 130 to re-calculate parity.

The data interleaver 122 performs interleaving for the inputted data, like the interleaving rule of data interleaver 112.

Figure 3:
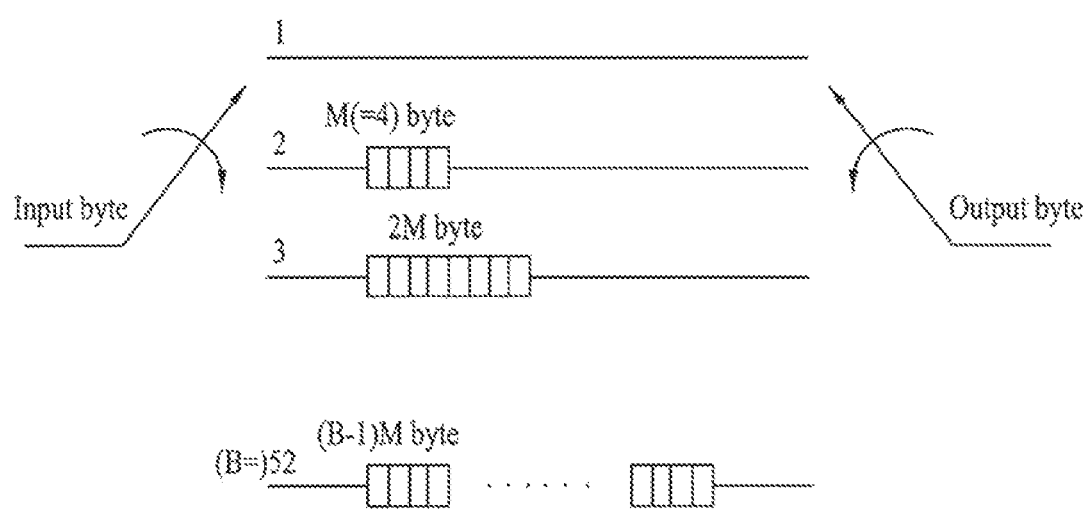
FIG. 3 illustrates a schematic block diagram for a structure of a data interleaver of FIG. 1.

FIG. 3 illustrates a schematic block diagram for a structure of a data interleaver (122 or 112) of FIG. 1, or a convolution interleaver of which branch number is 52 and the number M of a unit memory byte is 4.

As shown in FIG. 3, when a first byte is inputted thereto, it is outputted through the first branch, and a second byte is inputted thereto through a second branch. Therefore, a value before 52*4 bytes is outputted.

Figure 4:
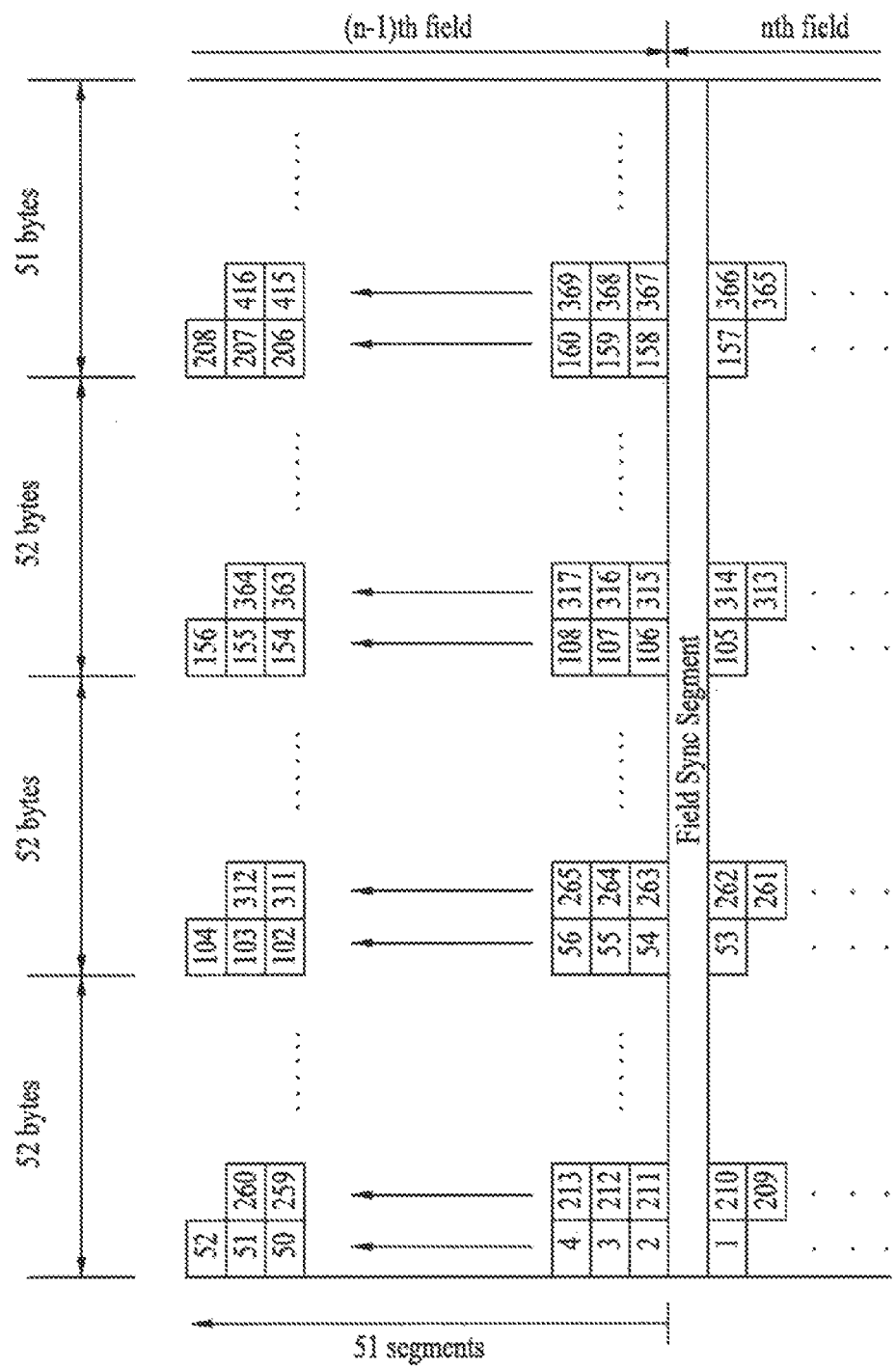
FIG. 4 illustrates a view for describing a sequence of output of a data interleaver in the VSB frame.

FIG. 4 illustrates a view for describing a sequence of output of a data interleaver of FIG. 3 in the VSB frame. The data is sequentially inputted from the lower part to the upper part, based on segment units, in which bytes in the segment are sequentially inputted thereto from left to right. The numerals of FIG. 4 are indicative of the output sequence of the data interleaver. The data interleaver is operated on the basis of unit of 52 segments.

The output of the data interleaver 122 is inputted to the Trellis encoding unit 123. The Trellis encoding unit 123 encodes the inputted 2 bits to 3 bits to output it thereto. The output of the Trellis encoding unit 123 is inputted to the frame multiplexer 140. The frame multiplexer 140 inserts a field synchronization bit and a segment synchronization bit to the output of the Trellis encoding unit 123 to transmit it to the transmitting unit 150. The transmitting unit 150 includes a pilot inserter 151, a VSB modulator 152, and an RF converter 153. Since the transmitter unit 150 is operated as the conventional VSB transmitter, its detailed description will be omitted.

In order to use the output data of the Trellis encoding unit 123 as the known data which was defined in the transmitting/ receiving ends, it is necessary to initialize a memory of the Trellis encoding unit 123 before the known data inserted in the enhanced data packet is processed. The input of the Trellis encoding unit 123 is needed to perform substitution for the initialization. RS parity affected by the changed data is re-calculated to be substituted with the original parity data. Such a procedure is performed in the compatible processor 130.

Figure 2:
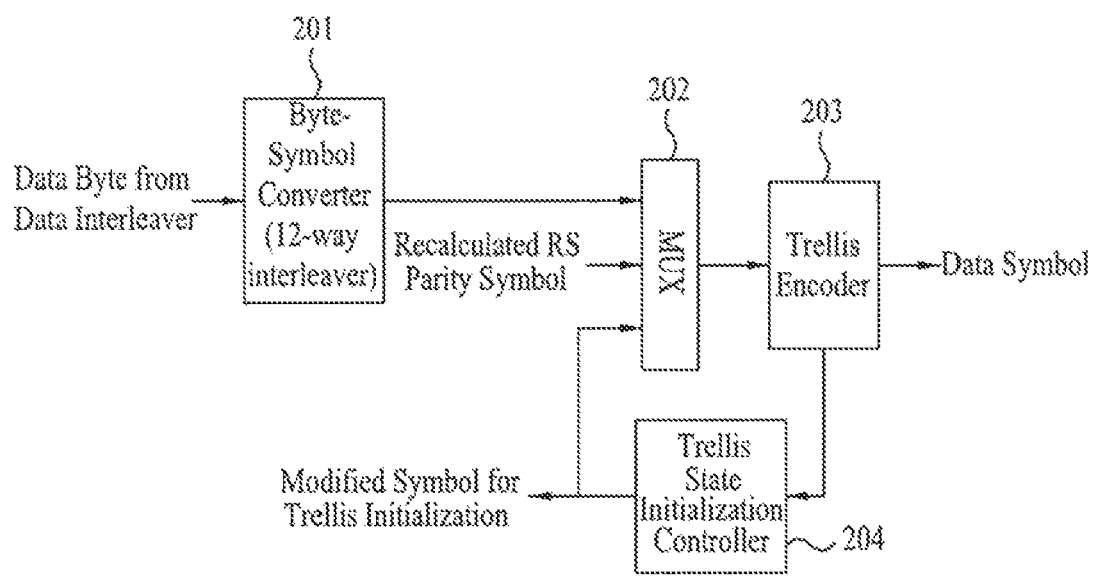
FIG. 2 illustrates a detailed block diagram of a Trellis encoder of FIG. 1, according to an embodiment of the present invention.

FIG. 2 illustrates a detailed block diagram of a Trellis encoding unit 123 of FIG. 1, which is initializable.

The Trellis encoding unit 123 which is initializable includes a byte-symbol converter 201, a multiplexer 202 for selecting one of inputs thereof, a Trellis encoder 203 for inputting the selected input from the multiplexer 202, and a Trellis state initialization controller 204 for initializing the Trellis encoder 203.

Such Trellis encoding unit is operated as follows. The byte-symbol converter 201 inputs interleaved data based on byte units to convert it to interleaved data based on symbol units, and then performs 12-way interleaving for the data to output it to the multiplexer 202.

For a normal case, the output of the byte-symbol converter 201 is selected by the multiplexer 202 such that the output can be transmitted to the Trellis encoder 203 through the multiplexer 202. On the other hand, when the interleaved data is known data and the known data is the beginning portion of the successively inputted known data stream, it is necessary to initialize the Trellis encoder 203, since the Trellis encoder 203 has a memory and thus its present output is affected by present and past inputs. Therefore, in order to output a predetermined signal at a certain time, the memory of the Trellis encoder 203 must be initialized at a certain value.

When the memory of the Trellis encoder 203 requires initialization thereof, a part of the known data is substituted with an initialization data to be outputted to the Trellis encoder 203. Afterwards, the memory of the Trellis encoder 203 is initialized to a predetermined value based on the initialization data. Therefore, from the time point of the initialization, the output of the Trellis encoder 203 can be the known data which is encoded to comply with the transmitting/receiving ends.

The Trellis state initialization controller 204 for initializing the Trellis encoder 203 inputs a memory value of the Trellis encoder 203 to generate initialization data to be inputted to the Trellis encoder 203 and then outputs it to the compatible processor 130.

Namely, the Trellis encoder 203 is operated such that upper bit of the two bits composing a symbol is encoded to a single bit using a single memory to be outputted, and the lower bit is encoded to two bits using the two memories to be outputted. Here, when the input data is known data and thus the known data is the beginning of the successively inputted known data stream, the memories must be initialized to output the inputted data as desired known data, after the inputted data undergoes Trellis encoding. Therefore, when the memory of the Trellis encoder 203 requires initialization, the Trellis state initialization controller 204 generates initialization data according to a present state and a desired initialization state of the memory, and then outputs it to the multiplexer 202.

The initialization data is formed by 4 bits, or two symbols. Here, there may be a plurality of the Trellis encoder 203, for example, 12. The 12 bytes outputted from the multiplexer 202 are sequentially inputted to the each of the Trellis encoders 203. Here, the beginning 4 bits of each byte, or two symbols, can be initialization data. Namely, the initialization controller 204 generates initialization data and then outputs it to the multiplexer 202 and the compatible processor 130, in which the initialization data initializes the memory of the Trellis encoder 203 in first two symbol intervals at which the known data symbol stream is started.

The compatible processor 130 inputs the output of the RS encoder/Non-systematic RS parity holder inserter 121 and the output of the initialization controller 204 and then generates non-systematic 20 byte parity to be outputted to the multiplexer 202 of the Trellis encoding unit 123.

Namely, since the memory of the Trellis encoding unit 123 is initialized by new data but not by data which is interleaved in the data interleaver 122, RS parity must be re-generated to substitute the original parity data. Such procedure is performed in the compatible processor 130.

The compatible processor 130 includes a packet buffer 131, a symbol-byte converter 132, a non-systematic RS encoder 133, and a byte-symbol converter 134.

Namely, the output of the RS encoder/Non-systematic RS parity holder inserter 121 is inputted to the data interleaver 122 and the packet buffer 131. The initialization data of the initialization controller 204 is inputted to the multiplexer 202 of the Trellis encoding unit 123 and the symbol-byte converter 132 of the compatible processor 130.

Here, since the RS encoder/Non-systematic RS parity holder inserter 121 inputs and outputs its input and output based on byte unit, the symbol-byte converter 132 converts the initialization data of symbol unit to the initialization of byte unit and then outputs it to the packet buffer 131.

The packet buffer 131 inputs the byte output from the RS encoder/Non-systematic RS parity holder inserter 121 and the byte output from the symbol-byte converter 132 to temporarily store them and then outputs them to the non-systematic RS encoder 133. The non-systematic RS encoder 133 inputs the byte output from the packet buffer 131 to generate parity of non-systematic 20 bytes and then outputs the parity based on symbol unit to the multiplexer 202 of the Trellis encoding unit 123 through the byte-symbol converter 134.

When the inputted data, which is interleaved and then converted to symbols, is the beginning of known data stream, the multiplexer 202 selects the initialization symbol of the initialization controller 204 instead of the inputted symbol, and then outputs it. When the inputted data is RS parity or parity place holder, the multiplexer 202 selects the output symbol of the symbol-byte converter 134 of the compatible processor 130 instead of the inputted symbol. Except for the above cases, the multiplexer 202 selects inputted data, which is interleaved and then converted to symbol, and then outputs it to the Trellis encoder 203. Namely, substitution of initialization symbol occurs at places of first two symbols in the known data stream, to be inputted to the Trellis encoder 203. Also, substitution of parity symbol, which is re-calculated in the compatible processor 130, occurs at the parity place of each packet, to be outputted to the Trellis encoder 203. Especially, when the RS encoder/Non-systematic RS parity holder inserter 121 does not insert a non-systematic RS parity to the enhanced data packet but instead inserts a null byte, the compatible processor 130 calculates non-systematic RS parity of the enhanced data packet, regardless of initialization of the Trellis encoder, to perform substitution using the calculation result.

The Trellis encoder 203 performs Trellis encoding for the data outputted from the multiplexer 202, based on symbol unit, and then outputs it to the frame multiplexer 140. Also, the Trellis encoder 203 outputs its memory state to the initialization controller 204.

Known Data Insertion and Non-systematic RS Parity Place

The following is a description for insertion of known data and setting of a non-systematic RS parity place.

Figure 5A:
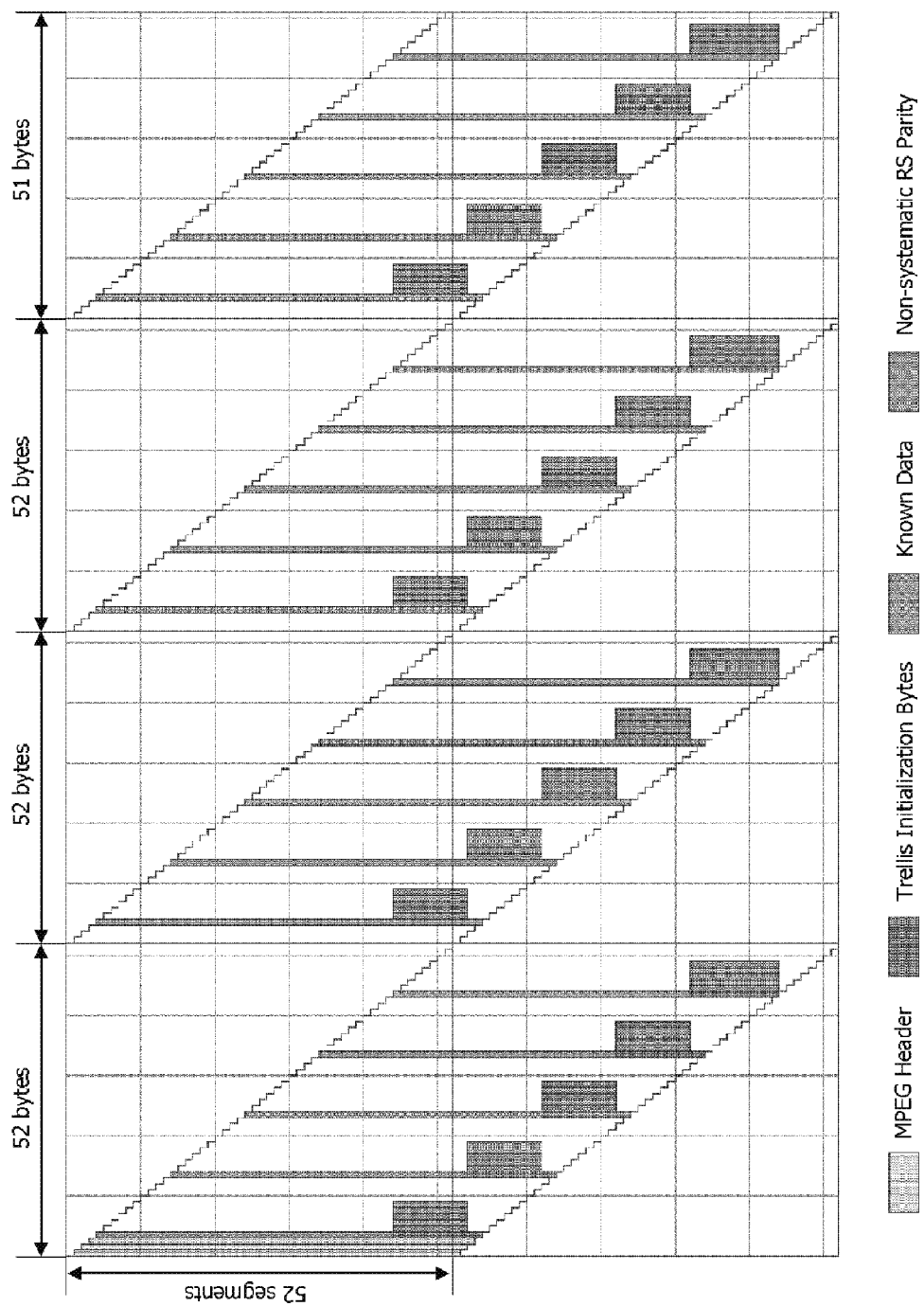
FIG. 5A illustrates data configuration at the input end of the data interleaver as known data is inserted thereto, according to the present invention.
Figure 5B:
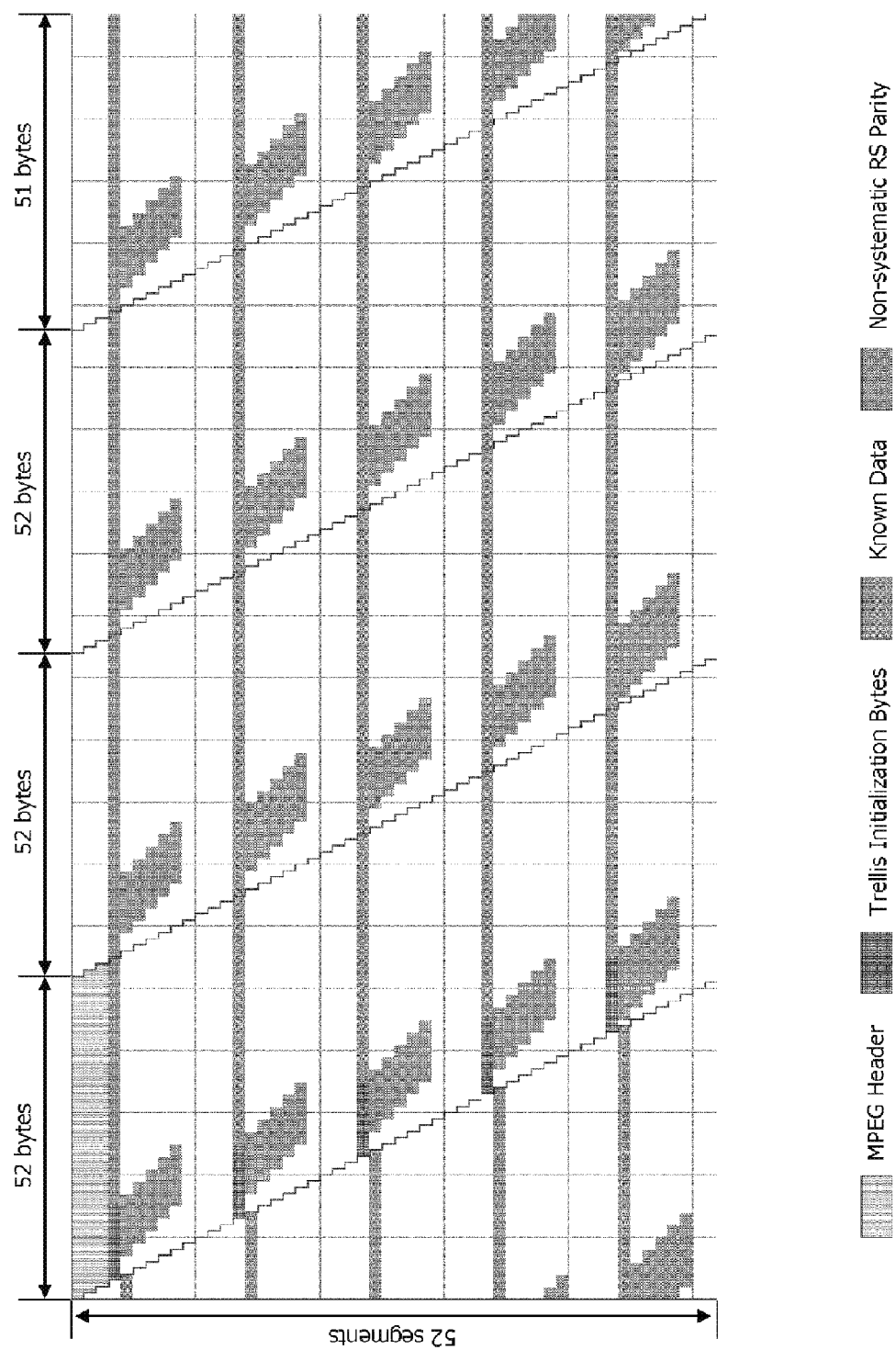
FIG. 5B illustrates data configuration at the output end of the data interleaver as known data is inserted thereto, according to the present invention.

FIG. 5A illustrates data configuration at the input end of the data interleaver as known data is inserted thereto. FIG. 5B illustrates data configuration at the output end of the data interleaver as the data of FIG. 5A is inserted thereto.

Namely, a receiver sequentially inputs data from the output end of the data interleaver outputted as the data interleaver output. Also, known data must be successively inputted thereto in response to the sequence of number of FIG. 4, such that the receiver can receive timely successive known data. As shown in FIG. 5B, in order that a single data segment, which is received in the receiver, is all known data, the single data segment is divided into 52 byte units, as shown in FIG. 5A. Afterwards, the known data is inserted thereto at a place of data segment at each 52 byte unit. Here, the beginning part of the known data stream needs initialization byte. Therefore, when the place of known data is determined in the data segment, a place of the initialization byte is determined as the place at which normal data ends and the known data is started, from the point of view of the output end of the data interleaver. When the place of initialization byte of the known data is determined, the place of a non-systematic RS parity byte can be determined. The place is preferably located such that the parity bytes can be outputted latter than the initialization bytes, from the point of view of the output end of the data interleaver. Namely, for a single segment, as shown in FIG. 4, the lower order bit is outputted earlier from the data interleaver than the larger one. Therefore, the RS parity is preferably located later than the sequence number of the initialization bytes.

The following is another embodiment of a method for inserting known data thereto. As shown in FIG. 5B, when the known data is inserted after the MPEG header in a first segment, from the point of view of the output end of the data interleaver, or the known data is inserted from after the MPEG header to the end of the segment, since MPEG header bytes of a second segment have a certain value for enhanced data packets, the MPEG header bytes can be regarded as continuation data.

As such, the present invention serves to perform substitution of data to initialize the memory of the Trellis encoder to a predetermined initial state when the known data stream is started. Also, the present invention serves to perform non-systematic RS encoding for enhanced data packets to keep compatibility with conventional receivers by the substituted data or to insert known data in conventional systematic RS parity regions.

E-VSB Enhanced Encoder

On the other hand, the E-VSB enhanced encoder 113 performs additional encoding for enhanced data and then outputs it thereto. Namely, when the output of the data interleaver 112 is main data, the E-VSB enhanced encoder 113 does not change MPEG header byte, which is added in the E-VSB packet formatter 102, or RS parity or RS parity place byte, which are added to the enhanced data packet in the RS encoder/Non-systematic RS parity place holder inserter 111, and outputs them thereto.

Also, similar to main data, the known data is outputted thereto without additional encoding procedure. However, the method for processing the known data may be different from that for processing the main data.

For example, there is a method for outputting known data which is generated in a symbol region, instead of a known data place holder, in the E-VSB enhanced encoder 113, in a state where the known data place holder is inserted in the E-VSB packet formatter 102. Also, there is another method in which the E-VSB enhanced encoder 113 does not change data but outputs the data, in state where the known data is inserted in the E-VSB packet formatter 102.

Figure 6A:
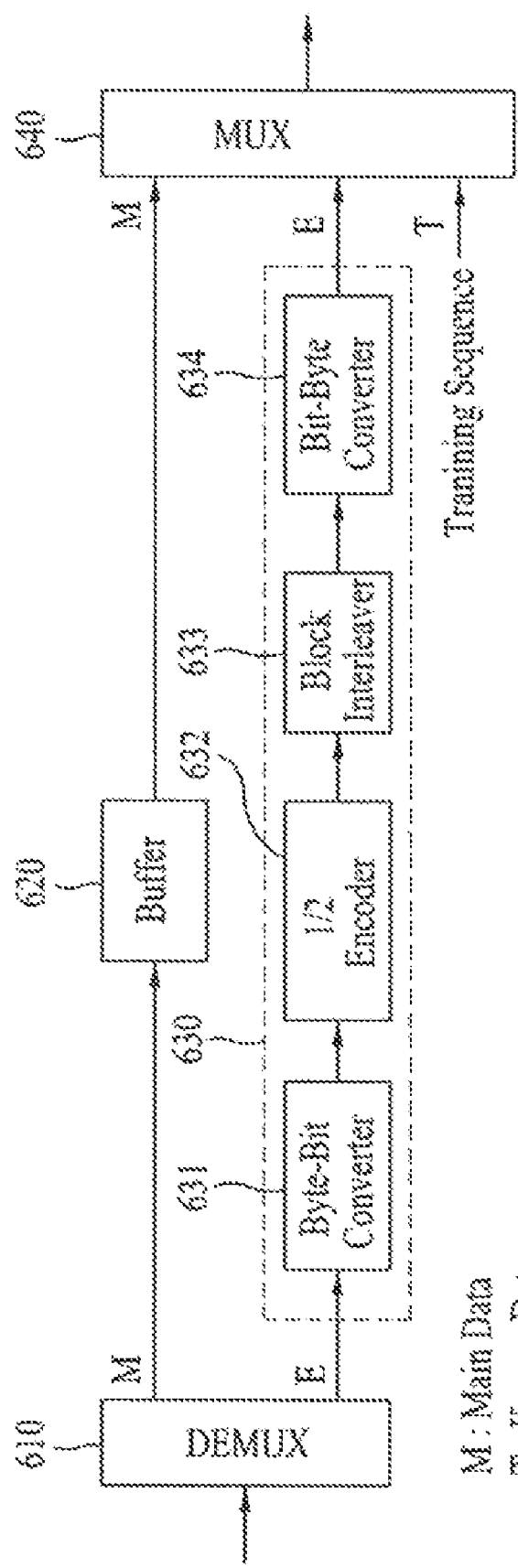
FIG. 6A illustrates a schematic block diagram of an embodiment of the E-VSB enhanced encoder according to the present invention.
Figure 6B:
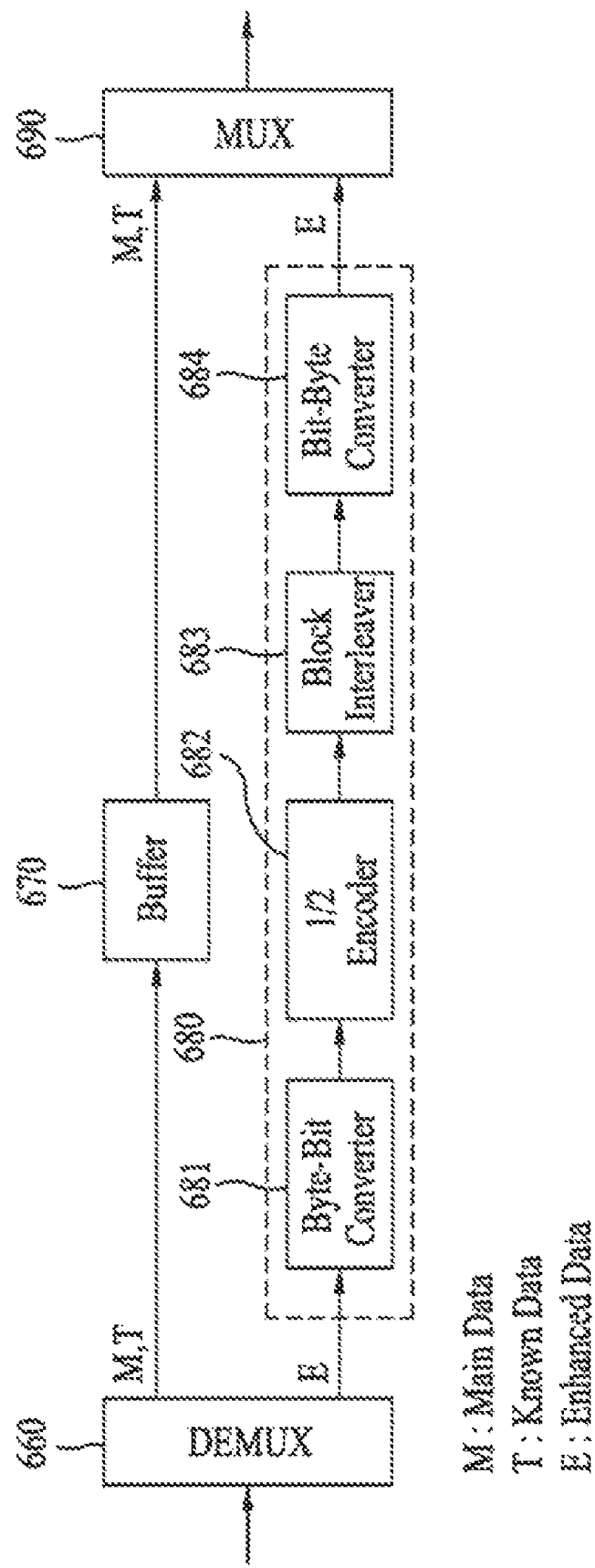
FIG. 6B illustrates a schematic block diagram of another embodiment of the E-VSB enhanced encoder according to the present invention.
Figure 7A:
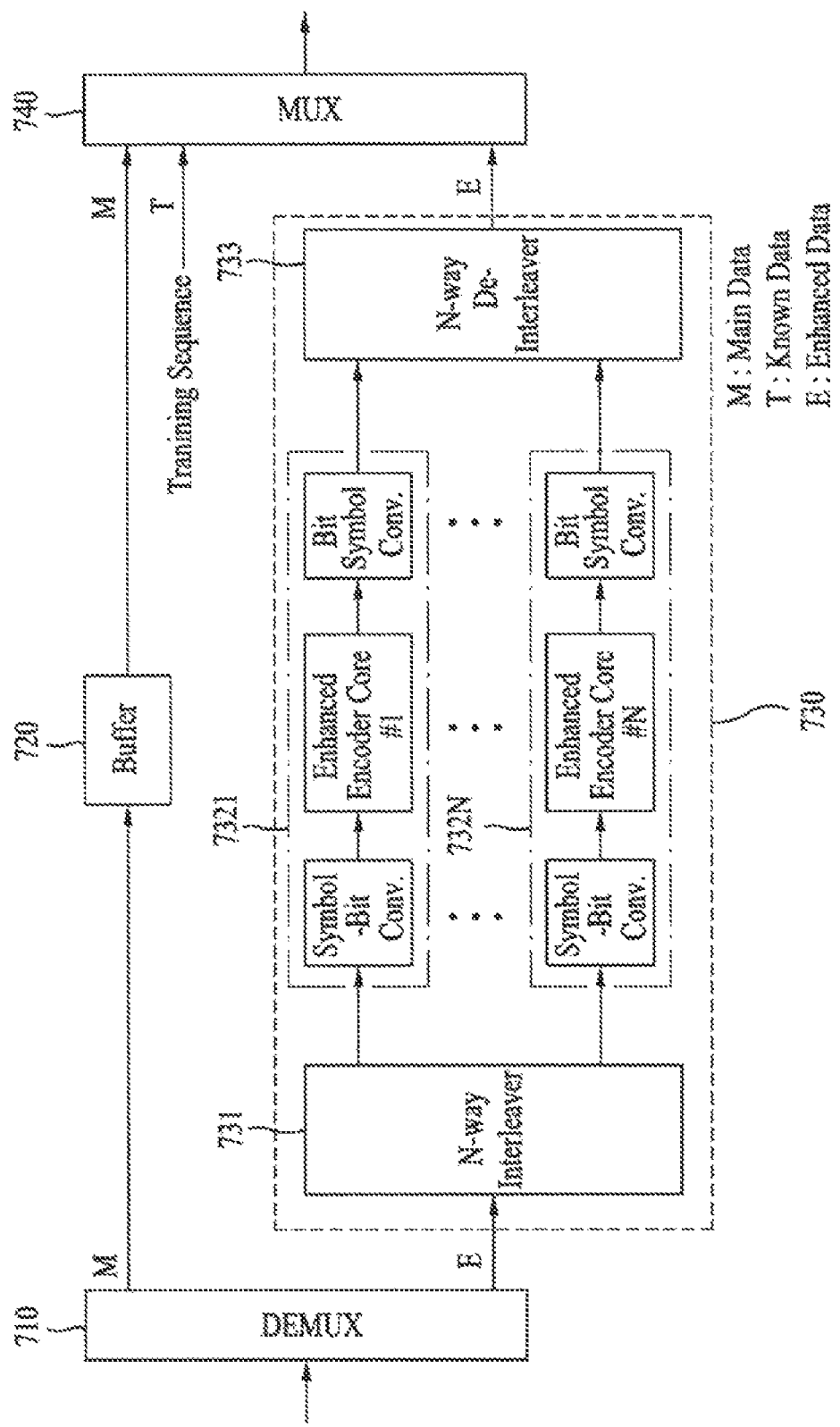
FIG. 7A illustrates a schematic block diagram of an embodiment of the E-VSB enhanced decoder according to the present invention.
Figure 7B:
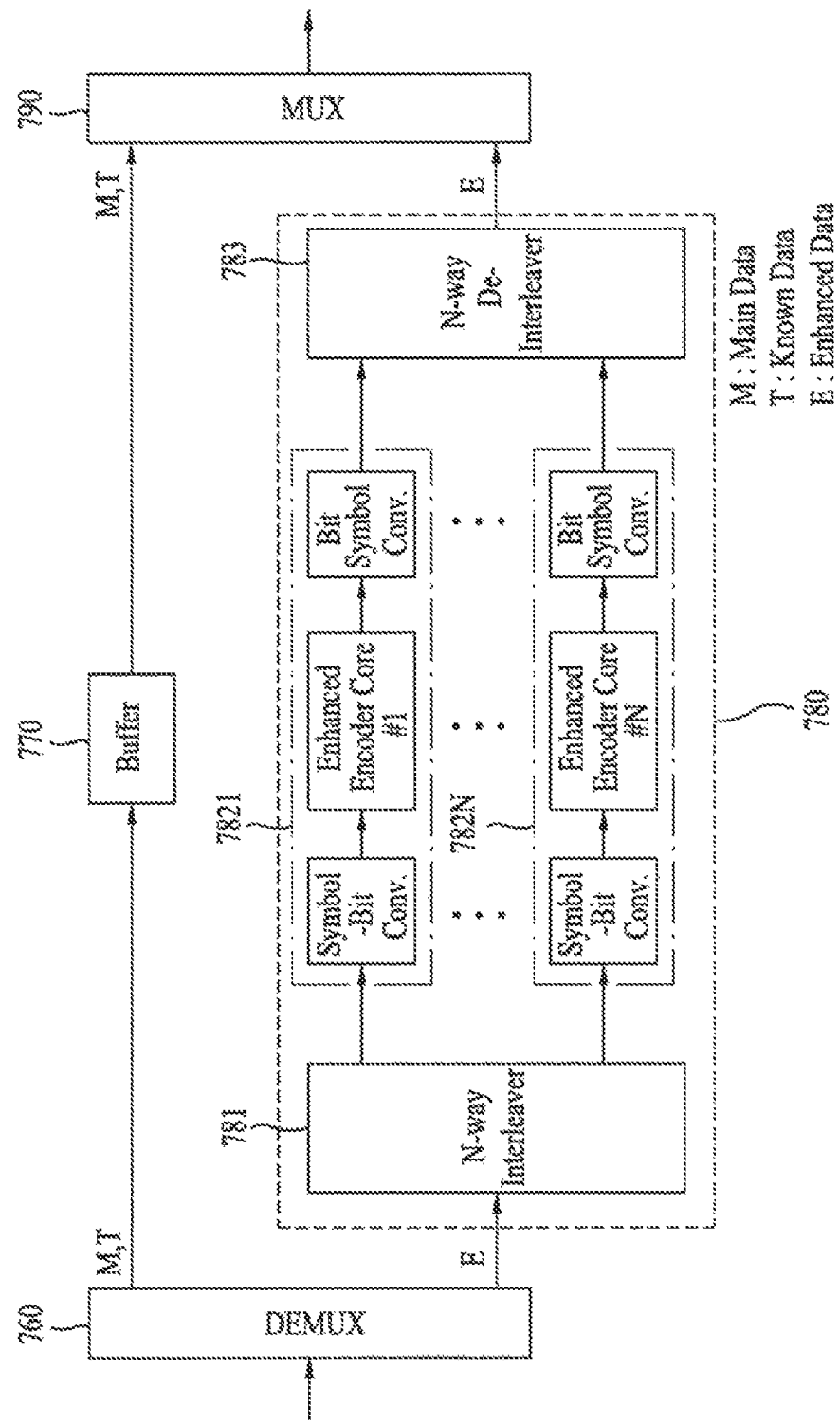
FIG. 7B illustrates a schematic block diagram of another embodiment of the E-VSB enhanced decoder according to the present invention.

The former method is described through FIG. 6A and FIG. 7a, and the latter method is described through FIG. 6B and FIG. 7B.

Firstly, as shown in FIG. 6A, the E-VSB enhanced encoder 113 includes a demultiplexer 610, a buffer 620, a U/C encoding unit 630, and a multiplexer 640.

The U/C encoding unit 630 serves to encode U bit of the enhanced data to C bit and then to output it thereto. For example, when 1 bit of the enhanced data is encoded to two bits to output it thereto, U is 1 and C is 2.

The U/C encoding unit 630 includes a byte-bit converter 631, a U/C encoder 632, a block interleaver 633, and a bit-byte converter 634. The U/C encoder 632 is implemented with a 1/2 encoder. The U/C encoder 632 and the block interleaver 633 (which is optional) are defined as an "enhanced encoder core" in the present invention.

As shown in FIG. 7A, the demultiplexer 610 outputs its output to the buffer 620 when inputted data is main data, and to the U/C encoding unit 630 when the inputted data is enhanced data.

The buffer 620 delays main data for a certain time, and then outputs it to the multiplexer 640. Namely, when main data is inputted to the demultiplexer 610, the buffer 620 is used to compensate time delay which is generated while the enhanced data is additionally encoded. Afterwards, the main data, whose time delay is controlled by the buffer 620, is transmitted to the data deinterleaver 114 through the multiplexer 640.

When the known data is inputted, the known data place holder is inserted thereto in the E-VSB packet formatter 102. The multiplexer 640 of the E-VSB enhanced encoder 113 selects the training sequence T instead of the known data place holder and then outputs it thereto. Therefore, the known data can be outputted without additional encoding.

On the other hand, the byte-bit converter 631 of the U/C encoding unit 630 converts the enhanced data byte to enhanced data bits and then outputs them to the 1/2 encoder 632. The 1/2 encoder 632 encodes inputted one bit to two bits to output them thereto.

The 1/2 encoder 632 is implemented with a convolution encoder or a low density parity check (LDPC) encoder, etc., which can use block codes. Also, the 1/2 encoder 632 may selectively adopt a block interleaver 633 according to implementation objectives.

For example, assuming that one byte of the enhanced data is extended to two bytes as null bits are inserted among bits thereof in the E-VSB pre-processor 101. The byte-bit converter 631 removes the null bits of inputted bytes and then outputs only effective data bits to the 1/2 encoder 632.

The 1/2 encoder 632 encodes one bit input to two bits, on the basis of block coding, and the block interleaver 633 inputs the two bits to perform block interleaving therefor.

The block interleaving is related to the total system performance and may be used in any interleavings, such as a random interleaving.

Here, the 1/2 encoder 632 performs encodings based on block units. The block size must be determined such that the block interleaver 633 can perform block interleaving.

According to the present invention, the block size can be determined by input format of the E-VSB enhanced encoder 113, as shown in FIG. 5B.

The following is a description for a method for determining block size with reference to the input format of FIG. 5B.

FIG. 5B shows that the number of parts to initialize the memory of Trellis encoder is 5 when interleaving unit is 52 segments. In this case, it can be divided from one block into four blocks.

Namely, for high block code performance of FIG. 5B, the block size can be preferably determined by the bit number of the enhanced data from first Trellis initialization to fifth Trellis initialization.

According to another embodiment, the block size can be determined by the bit number of the enhanced data from among the first Trellis initialization to third Trellis initialization. In this case, the enhanced data of one data interleaving unit, which must be encoded in the E-VSB enhanced encoder 113, is divided into two blocks and then encoded. Namely, the enhanced data among the first Trellis initialization and third Trellis initialization is encoded on the basis of one block size, and the enhanced data among the third Trellis initialization and the fifth initialization is encoded on the basis of another block size.

Also, according to a further embodiment, the block size can be determined as the bit number of the enhanced data between the first Trellis initialization and the second Trellis initialization. In this case, the enhanced data of one data interleaving unit, which must be encoded in the E-VSB enhanced encoder 113, is divided into four blocks and then encoded.

The enhanced data, which was used to determine the block size, must be additionally encoded in the E-VSB enhanced encoder 113. Here, the enhanced data does not include the known data and non-systematic RS parity.

The block size can be set with reference to the Trellis initialization, since data after Trellis initialization is not affected by inputs before the initialization. Namely, since the enhanced data have limited lengths with reference to the data of the Trellis initialization, start and end of classified blocks are determined. Therefore, encoding performance of the enhanced data, which is performed in the block coding, can be further increased.

The bit-byte converter 634 serves to convert output bits of the block interleaver 633 to bytes and then outputs them to the multiplexer 640.

The multiplexer 640 selects main data outputted from the buffer 620, when the inputted data is main data, and enhanced data, which is encoded in the U/C encoding unit 630, when the inputted data is the enhanced data. Also, when the inputted data is known data place holder, the multiplexer 640 selects training sequence to output it to the deinterleaver 114.

FIG. 6A illustrates a schematic block diagram of an embodiment of the E-VSB enhanced encoder, and FIG. 6B illustrates a schematic block diagram of another embodiment of the E-VSB enhanced encoder. FIG. 6A and FIG. 6B are different from one another, regarding a known data processing part. Namely, FIG. 6B is identical to FIG. 6A except that, when the inputted data is known data, the demultiplexer 660 outputs the known data to the buffer 670 such that the buffer 670 can delay a certain time and then output it to the deinterleaver 114 through the multiplexer 680. Therefore, the detailed description for FIG. 6B will be omitted.

Such processes are performed under the assumption that the known data is already inserted in the enhanced data packet in the E-VSB packet formatter 102.

As such, the present invention serves to initialize the memory of the Trellis encoder at the beginning part of the know data stream and perform additional encoding for the enhanced data, based on block coding, using the initialization. Therefore, performance of the additional encoding for the enhanced data can be increased.

FIG. 7A illustrates a schematic block diagram of an embodiment of the E-VSB enhanced decoder 113, and FIG. 7B illustrates a schematic block diagram of another embodiment of the E-VSB enhanced decoder 113.

Firstly, as shown in FIG. 7A, the E-VSB enhanced encoder 113 includes a demultiplexer 710, a buffer 720, an N-way encoder 730, and a multiplexer 740.

The N-way encoder 730 includes an N-way interleaver 731, an N-way deinterleaver 733 and N enhanced encoding units 7321~732N, which are connected, in parallel, between the N-way interleaver 731 and the N-way deinterleaver 733.

Each enhanced encoding unit includes a symbol-bit converter, an enhanced encoder core, and a bit-symbol converter. The enhanced encoder core includes a U/C encoder and a block interleaver. The U/C encoder is preferably implemented with a 1/2 encoder. The 1/2 encoder may use block codes of a convolution encoder or a low density parity check (LDPC) encoder. Also, the 1/2 encoder may selectively use a block interleaver according to implementation objectives.

As shown in FIG. 7A, when the inputted data is main data, the demultiplexer 710 outputs the main data to the buffer 720. When the inputted data is enhanced data, the demultiplexer 710 outputs the enhanced data to the N-way interleaver 731 of the N-way encoding unit 730.

The buffer 720 delays main data for a certain time, and then outputs it to the multiplexer 740. Namely, when main data is inputted to the demultiplexer 710, the buffer 720 is used to compensate time delay which is generated while the enhanced data is additionally encoded. Afterwards, the main data, whose time delay is controlled by the buffer 720, is transmitted to the data deinterleaver 114 through the multiplexer 740.

When the known data is inputted, the known data place holder is inserted thereto in the E-VSB packet formatter 102. The multiplexer 740 of the E-VSB enhanced encoder 113 selects the training sequence T instead of the known data place holder and then outputs it thereto. Therefore, the known data can be outputted without additional encoding.

On the other hand, the N-way interleaver 731 converts the enhanced data bytes to symbols, such that each of the symbols can be distributed to corresponding enhanced encoding unit. Namely, the enhanced data of the demultiplexer 710 are formed into N divided symbol outputs by the N-way interleaver 731 of the N-way encoding unit 730.

The N divided symbols are sequentially distributed to the N enhanced encoding units or non-sequentially distributed to the encoding units based on a pre-set interleaving sequence.

For example, when N is 4, one byte is changed to 4 symbols. Therefore, the 4 symbols are distributed to the four enhanced encoding units, in sequence or in a predetermined interleaving sequence. Also, symbols located at the same places in each of the four bytes are distributed to 4 enhanced encoding units based on a predetermined sequence.

The enhanced encoding units have the same structure, such that they can operate identically.

Therefore one of the enhanced encoding units will be described in detail. Namely, the symbol-bit converter in the enhanced encoding unit inputs a symbol distributed from the N-way interleaver 731 to convert it to bits. Afterwards, a null bit of the bits is removed, such that only effective data bits can be outputted to the enhanced encoder core, in which the null bit is inserted thereto through null extension in the E-VSB pre-processor 101.

For example, let's assume that on byte of enhanced data is extended to two bytes as null bits are inserted among bits in the E-VSB pre-processor 101. Then, the symbol-bit converter removes the null bits and outputs only effective data bits.

The 1/2 encoder in the enhanced encoder core encodes one bit of input to two bits, based on block coding, and then outputs them thereto. The block interleaver inputs the output of the 1/2 encoder to perform block interleaving.

Here, the block size for block coding or block interleaving is determined as the block size defined in FIG. 6A and FIG. 6B is divided by the number of ways N of N-way interleaving. For example, the largest block size can be determined as the bit number of effective enhanced data is divided by N, in which the effective enhanced data is located among the first initialization to the last fifth initialization, of Trellis initialization to form known data as shown in FIG. 5B. On the other hand, as described above, block interleaving having the block size may be used in any interleaving operations is related to the total system performance and may be used in any interleavings, such as a random interleaving.

The output of the enhanced encoder core is converted to symbols in the bit-symbol converter and then outputted to the N-way deinterleaver 733. The N-way deinterleaver 733 performs deinterleaving for the symbols outputted from the respective enhanced encoding units and then outputs them to the multiplexer 740. Here, the N-way deinterleaver 733 performs a reverse operation of the N-way interleaver 731.

When inputted data is main data, the multiplexer 740 selects the main data outputted from the buffer 720. When the inputted data is enhanced data, the multiplexer 740 selects the enhanced data outputted from the N-way encoding unit 730. Also, when the inputted data is known data place holder, the multiplexer 740 selects training sequence to output it to the data deinterleaver 114.

FIG. 7A and FIG. 7B are different from one another, regarding a known data processing part. Namely, FIG. 7B is identical to FIG. 7A except that, when the inputted data is known data, the demultiplexer 760 outputs the known data to the buffer 770 such that the buffer 770 can delay a certain time and then output it to the deinterleaver 114 through the multiplexer 780. Therefore, the detailed description for FIG. 7B will be omitted.

Such processes are performed under the assumption that the known data is already inserted in the enhanced data packet in the E-VSB packet formatter 102.

Figure 8:
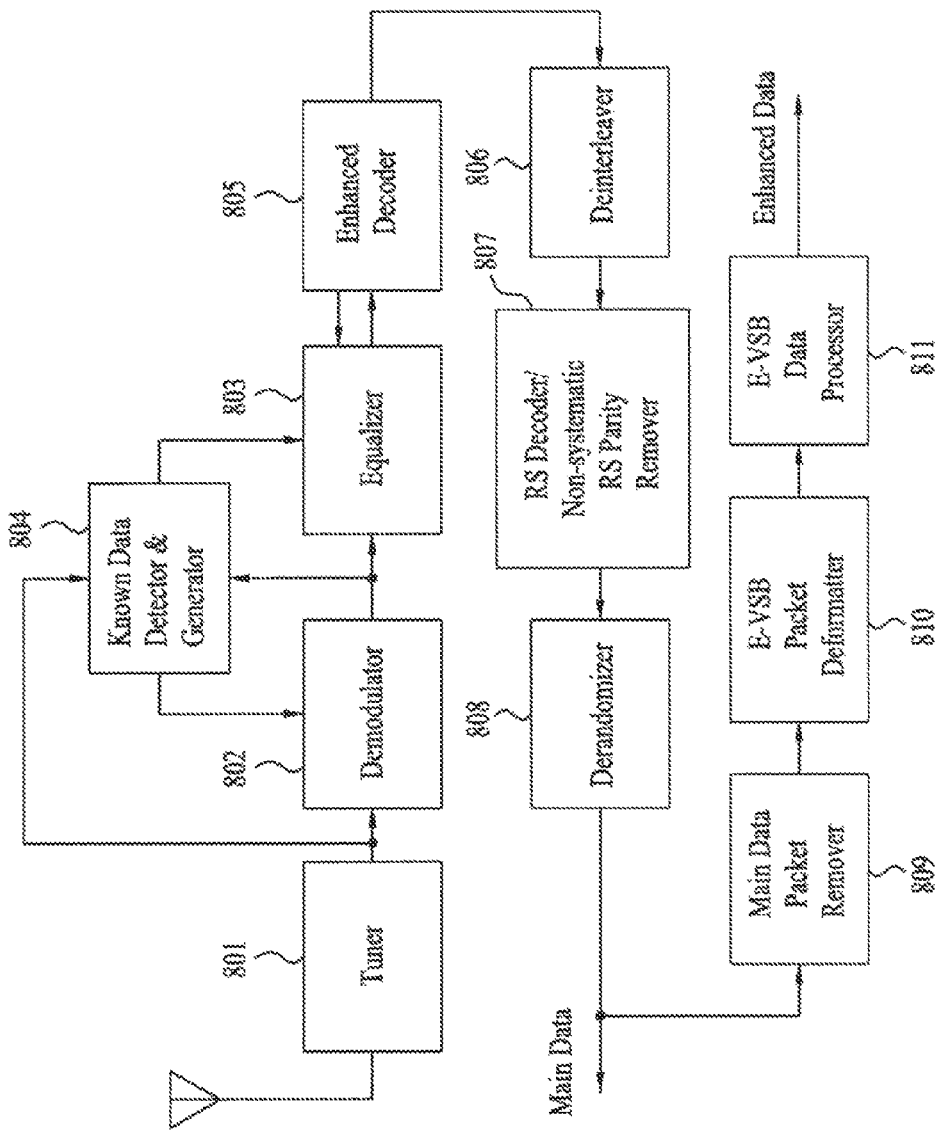
FIG. 8 illustrates a schematic block diagram of a digital broadcast receiving system according to an embodiment of the present invention.

FIG. 8 illustrates a schematic block diagram of a digital broadcast receiving system according to an embodiment of the present invention, in which the digital broadcast receiving system receives data, which are transmitted from the digital broadcast transmitting system of FIG. 1, and performs modulation and equalization for the received data to restore original data.

The digital broadcast receiving system includes a tuner 801, a demodulator 805, an equalizer 803, a known data detector/generator 804, an enhanced decoder 805, a data deinterleaver 806, an RS decoder/non-systematic RS parity remover 807, and a derandomizer 808.

Also, the digital broadcast receiving system further includes a main data packet remover 809, an E-VSB packet deformatter 810, and an E-VSB data processor 811.

Namely, the tuner 801 serves to tune a particular channel frequency to perform down converting and then outputs it to the demodulator 802 and the known data detector/generator 804.

The demodulator 802 performs carrier restoring and timing restoring for the tuned channel frequency to generate a base band signal and then output it to the equalizer 803 and the known data detector/generator 804.

The equalizer 803 compensates distortion in the channel included in the demodulated signal and then outputs it to the enhanced decoder 805.

Here, the known data detector/generator 804 detects known data place, which is inserted in the transmitting end, from input/output data of the demodulator 802, and then outputs symbol stream of the known data, which is generated in the known data place, to the equalizer 803 and the enhanced decoder 805. Here, the input/output data of the demodulator 802 are indicative of data before or after performing demodulation. Also, the known data detector/generator 804 outputs information to the enhanced decoder 805, such that enhanced data, which performs additional encoding through the enhanced decoder 805, can be discriminated from the main data, which does not perform additional encoding, and such that a beginning point of a block of the enhanced encoder core, which is discriminated by the Trellis initialization of FIG. 5B, can be notified.

The demodulator 802 enhances its modulation performance using the known data symbol stream when performing timing restoration or carrier restoration. The equalizer 803 enhances its equalization performance using the known data. The enhanced decoder 805 identifies the beginning and end of a block and restores data based on the identified result.

Namely, the enhanced decoder 805 performs encoding for main data symbols and enhanced data symbols, which are outputted from the equalizer 803, to convert them to bytes and then outputs them to the deinterleaver 806. Such processes will be described in detail as follows.

The deinterleaver 806 performs deinterleaving and outputs the deinterleaving result to the RS decoder/non-systematic RS parity remover 807. Here, the deinterleaver 806 performs a reverse operation of the data interleaver at the transmitting end. When the inputted packet from the RS decoder/non-systematic RS parity remover 807 is main data packet, systematic RS decoding is performed. When the inputted packet is enhanced data packet, non-systematic RS parity byte, which is inserted to the packet, is removed and then outputted to the derandomizer 808.

The derandomizer 808 performs derandomizing for output of the RS decoder/non-systematic RS parity remover 807 and then inserts MPEG synchronization byte to the front part of each packet to output it, based on 188 byte packet unit, thereto. Here, the derandomizer 808 operates a reverse operation of the randomizer.

The derandomizer 808 outputs its output to a main MPEG decoder (not shown) and the main data packet remover 809, simultaneously. The main MPEG decoder performs decoding for only packet corresponding to the main MPEG, since the enhanced data packet is not used in a conventional VSB receiver or has null or reserved PID. Therefore, the enhanced data packet is not used in the main MPEG decoder and is thus ignored.

The main data packet remover 809 removes a main data packet of 188 byte unit from the output of the derandomizer 808 and outputs it to the E-VSB packet deformatter 810. The E-VSB packet formatter 810 removes MPEG header of 4 bytes from the enhanced data packet which is outputted from the main data packet remover 809, in which the MPEG header of 4 bytes is inserted to the enhanced data packet by the E-VSB formatter at the transmitting end. Also, the E-VSB packet formatter 810 removes bytes to which place holder (not enhanced data) is inserted at the transmitting end, for example place holders for known data, and then outputs them to the E-VSB data processor 811. The E-VSB data processor 811 performs a reverse operation of E-VSB pre-processor 101 at the transmitting end for the output of the E-VSB packet deformatter 810, and then outputs enhanced data.

On the other hand, the data inputted to the enhanced decoder 805 may be any of main data or known data, or enhanced data. Here, the main data and known data do not undergo additional encoding but only Trellis encoding. Also, the enhanced data undergoes all the additional encoding and Trellis encoding.

When the inputted data are main data or known data (or known data place holder), the enhanced decoder 805 performs Viterbi decoding for the inputted data or performs hard determination for soft determination value, and then outputs the result thereto. Also, the transmitting end regards RS parity byte and MPEG header byte, which are added to the enhanced data packet at the transmitting end, as main data, and does not perform additional encoding therefor. Therefore, Viterbi decoding is performed or hard determination is performed for soft determination value, such that the result can be outputted.

On the other hand, when the inputted data is enhanced data, the enhanced decoder 805 performs soft determination decoding to obtain a soft determination value, and performs decoding for the soft determination value, such that decoding processes for the enhanced data can be completed. Here, the decoding for the soft determination value is a reverse operation of the enhanced encoder core at the transmitting end.

Here, when the enhanced encoder core includes a 1/2 encoder and a block interleaver to perform a reverse operation thereof, the receiving end must include a block deinterleaver and a 1/2 decoder, as reversely arranged. In this situation, the block deinterleaver performs deinterleaving for the received data and then the 1/2 decoder performs 1/2 decoding for the deinterleaving result. On the other hand, when the block interleaver was not used at the transmitting end, the receiving end does not need the block deinterleaver.

Namely, the enhanced decoder 805 performs decoding for the enhanced data as a decoder whose structure is configured such that a Trellis decoder, a block deinterleaver (optional), and a 1/2 decoder are adjacently connected to each other.

When the Trellis decoder and 1/2 decoder are configured as an enhanced decoder to output a soft determination value, the soft determination value of the Trellis decoder can assist determination of the 1/2 decoder. The 1/2 decoder receiving such assistance of the Trellis decoder can return its soft determination value to the Trellis decoder, such that it can assist determination of the Trellis decoder. Such decoding is referred to as turbo decoding. When the turbo decoding is adopted, the total decoding performance can be enhanced.

There are algorithms to output the soft determination value, such as Soft Output Viterbi Algorithm (SOVA), Sub-optimum Soft output Algorithm (SSA), and Maximum A Posteriori (MAP), etc. Here, from the point of view of symbol errors, the MAP algorithm is superior to the SOVA algorithm. The MAP algorithm calculates probability in log domain while its performance does not decrease, and does not need estimation of noise distribution.

As the transmitting method of the present invention is described above, when a block is used for initialization of a memory state of the Trellis encoding unit such that the memory of the Trellis encoding unit is returned from a pre-determined state value to another the predetermined state value, the receiving end determines a soft determination value using algorithms, such as a MAP algorithm or a SOVA, etc., thereby obtaining optimal performance.

As described above, the digital broadcast system and the process method thereof according to the present invention have advantages in that errors hardly occur when enhanced data are transmitted through channels and they also are compatible with the conventional VSB receivers. Also, the digital broadcast system and the process method thereof can receive enhanced data without errors through channels in which ghost images and noise are a serious problem, compared with the conventional VSB system.

Also, as known data are inserted to a particular place in data region and then transmitted, receiving performance of a receiving system, whose channel variation is serious, can enhanced.

Especially, the present invention initializes a memory of a Trellis encoder at the beginning part of the known data stream, and performs additional encoding, based on block coding for the enhanced data at the transmitting end, using the initialization, thereby increasing its encoding performance. Also, the receiving end performs soft determination decoding for enhanced data, which is encoded on the basis of block coding, thereby increasing its decoding performance.

The present invention is more effective as it is applied to portable and mobile receivers whose channels vary significantly. Also, the present invention remarkably shows its effect in receivers which require robustness against noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital broadcast transmitter comprising:
a byte-bit converter configured to convert enhanced data bytes into bit units and output enhanced data bits;
a first encoder configured to encode each of the enhanced data bits at a code rate of 1/H, wherein H is an integer greater than 1;
a deinterleaver configured to deinterleave enhanced data corresponding to the encoded enhanced data bits;
a removing unit configured to remove Reed Solomon (RS) parity data place holders inserted in pre-determined positions within enhanced data packets including the deinterleaved enhanced data;
a second encoder configured to perform non-systematic RS encoding on the enhanced data packets from which the RS parity data place holders are removed in order to insert RS parity data in the enhanced data packets; and
an interleaver configured to interleave data in the RS-encoded enhanced data packets,
wherein an output of the interleaver comprises a first data group including rows having a length of 207 bytes,
wherein an ith row in the first data group has N consecutive Moving Picture Experts Group (MPEG) header bytes,
wherein an input of the interleaver comprises a second data group including rows having a length of 207 bytes,
wherein a jth row in the second data group has M consecutive MPEG header bytes,
wherein N>M, and
wherein i, j, M and N are integers greater than 1.

2. The digital broadcast transmitter of claim 1, wherein the first data group further includes known data sequences.

3. The digital broadcast transmitter of claim 2, further comprising:
a trellis encoding unit configured to trellis encode data in the first data group,
wherein the trellis encoding unit includes at least one memory that is initialized by initialization data in the first data group that is just prior to at least one of the known data sequences.

4. A method of processing broadcast data in a digital broadcast transmitter, the method comprising:
- converting, in a byte-bit converter, enhanced data bytes into bit units to output enhanced data bits;
- encoding, in a first encoder, each of the enhanced data bits at a code rate of 1/H, wherein H is an integer greater than 1;
- deinterleaving, in a deinterleaver, enhanced data corresponding to the encoded enhanced data bits;
- removing, in a removing unit, Reed-Solomon (RS) parity data place holders inserted in pre-determined positions within enhanced data packets including the deinterleaved enhanced data;
- performing, in a second encoder, non-systematic RS encoding on the enhanced data packets from which the RS parity data place holders are removed in order to insert RS parity data in the enhanced data packets; and
- interleaving, in an interleaver, data in the RS-encoded enhanced data packets,
- wherein an output of the interleaver comprises a first data group including rows having a length of 207 bytes,
- wherein an ith row in the first data group has N consecutive Moving Picture Experts Group (MPEG) header bytes,
- wherein an input of the interleaver comprises a second data group including rows having a length of 207 bytes,
- wherein a jth row in the second data group has M consecutive MPEG header bytes,
- wherein N>M, and
- wherein i, j, M and N are integers greater than 1.

5. The method of claim 4, wherein the first data group further includes known data sequences.

6. The method of claim 5, further comprising:
- trellis encoding, in a trellis encoding unit, data in the first data group,
- wherein at least one memory in the trellis encoding unit is initialized by initialization data in the first data group that is just prior to at least one of the known data sequences.

* * * * *